United States Patent

Bryan et al.

[11] Patent Number: 6,037,842
[45] Date of Patent: Mar. 14, 2000

[54] COMPLEMENTARY METAL-OXIDE SEMICONDUCTOR VOLTAGE CONTROLLED OSCILLATOR (CMOS VCO)

[75] Inventors: Thomas Clark Bryan; Allen Carl Merrill, both of Encinitas, Calif.

[73] Assignee: Applied Micro Circuits Corporation, San Diego, Calif.

[21] Appl. No.: 09/063,526

[22] Filed: Apr. 21, 1998

[51] Int. Cl.[7] .................................................. H03B 5/24
[52] U.S. Cl. .......................... 331/57; 331/48; 331/108 C; 331/177 R; 327/280; 327/281
[58] Field of Search ........................... 331/57, 34, 177 R, 331/46, 48, 111, 108 C, 143; 327/280, 281, 274, 287, 288

[56] References Cited

U.S. PATENT DOCUMENTS 4,884,041  11/1989  Walker ........................................ 331/57
5,841,325  11/1998  Knotts et al. .............................. 331/57

*Primary Examiner*—David Mis
*Attorney, Agent, or Firm*—Gray Cary Ware Freidenrich

[57] ABSTRACT

An integrated circuit complementary metal-oxide silicon (CMOS) voltage controlled oscillator (VCO) includes a plurality of variable delay elements, connected in a ring configuration, each variable delay element including a pair of parallel connected differential CMOS sections. The parallel-connected differential CMOS sections of each variable delay element are controlled by a differential control voltage whose magnitude sets relative levels of operation of the two differential sections of each variable delay element. These relative levels of operation determine the delay through the variable delay element. A current mirror circuit provides the differential control voltage.

20 Claims, 2 Drawing Sheets

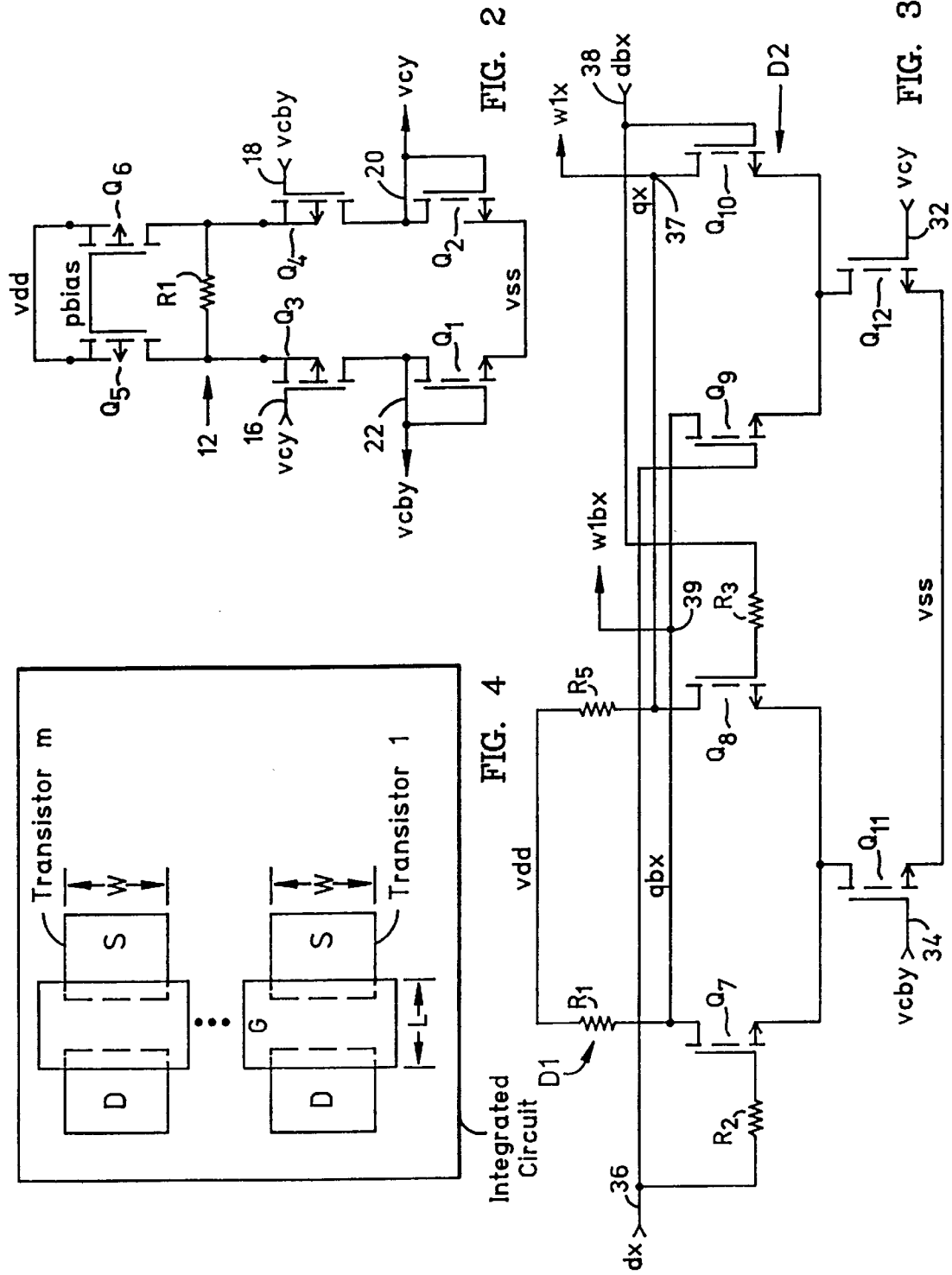

COMPLEMENTARY METAL-OXIDE SEMICONDUCTOR VOLTAGE CONTROLLED OSCILLATOR (CMOS VCO)

CROSS-REFERENCE TO RELATED APPLICATIONS

U.S. Ser. No. 08/856,259, filed on May 14, 1997, entitled LC OSCILLATOR WITH DELAY TUNING; and U.S. Ser. No. 09/063,527, filed Apr. 21, 1998, entitled CONTROL CIRCUIT FOR A COMPLEMENTARY METAL-OXIDE SEMICONDUCTOR VOLTAGE CONTROLLED OSCILLATOR.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

This invention relates to a CMOS VCO architecture for integrated circuit applications, including data communications. More particularly, the invention concerns a CMOS VCO in the form of an oscillator including a plurality of variable delay elements in which the delay through each variable delay element may be varied in response to a differential voltage.

The design of phase-lock loops for implementation in integrated electronic circuits (ICs) always includes a voltage controlled oscillator (VCO) that converts an input voltage to a signal having a frequency linearly dependent on the magnitude of the voltage. Typically, the VCO in an integrated circuit comprises a monolithic amplifier section with a resonant circuit external to the amplifier or a fully integrated solid state device, such as a ring oscillator, that does not include a resonator with reactive components.

Metal-oxide semiconductor (MOS) technology is virtually the standard for digital circuits that are used for computers and telecommunications. Increasingly, CMOS (complementary MOS) technology is utilized in these applications. CMOS technology incorporates both n-channel MOS and p-channel MOS transistors in the same monolithic structure Given the increasing use of CMOS technology for computer and telecommunications applications, VCOs in the form of fully integrated, solid state CMOS devices, such as ring oscillators, have been well received. See for example the current-starved inverter configuration set forth in N. E. Weste, et al., PRINCIPLES OF CMOS VLSI DESIGN, 2d Ed., 1993, at page 336. This CMOS VCO may exhibit instability in oscillation, and has a maximum frequency of operation in the MegaHertz range. Particularly desirable would be a CMOS VCO suitable for Gigahertz applications, with stable oscillation.

BRIEF SUMMARY OF THE INVENTION

Our invention utilizes CMOS technology for a VCO including a plurality of variable delay elements in which each variable delay element includes CMOS transistors connected differentially to provide differential variable delay through the element. Control of the variable delay through a variable delay element is linear and supports a broad tuning range. Control of device characteristics provides for oscillation at frequencies in the Gigahertz range.

It is therefore one objective of this invention to provide a CMOS VCO for an IC that may be fully integrated.

Another objective is to provide such a CMOS VCO in which tuning is provided by a plurality of variable delay elements, each of which differentially delays an oscillator feedback signal in response to a control voltage.

Yet another objective is to provide such a CMOS VCO in which variable delay is provided by differentially connected CMOS circuit elements.

These and other objectives of the invention are achieved by a CMOS VCO embodied as a ring oscillator that does not include a resonator with reactive elements.

BRIEF DESCRIPTION OF THE DRAWINGS

The objectives of this invention, as well as the invention itself, will now be explained in the following detailed description which refers to the drawings, in which:

FIG. 2 is a partial circuit schematic diagram showing a control circuit that produces a differential control voltage;

FIG. 3 is a schematic circuit diagram illustrating a variable delay element implemented in CMOS technology according to this invention; and FIG. 4 is a layout representation of a portion of an IC magnified to illustrate certain characteristics of a CMOS transistor used in this invention.

DETAILED DESCRIPTION OF THE INVENTION

Figure 1:
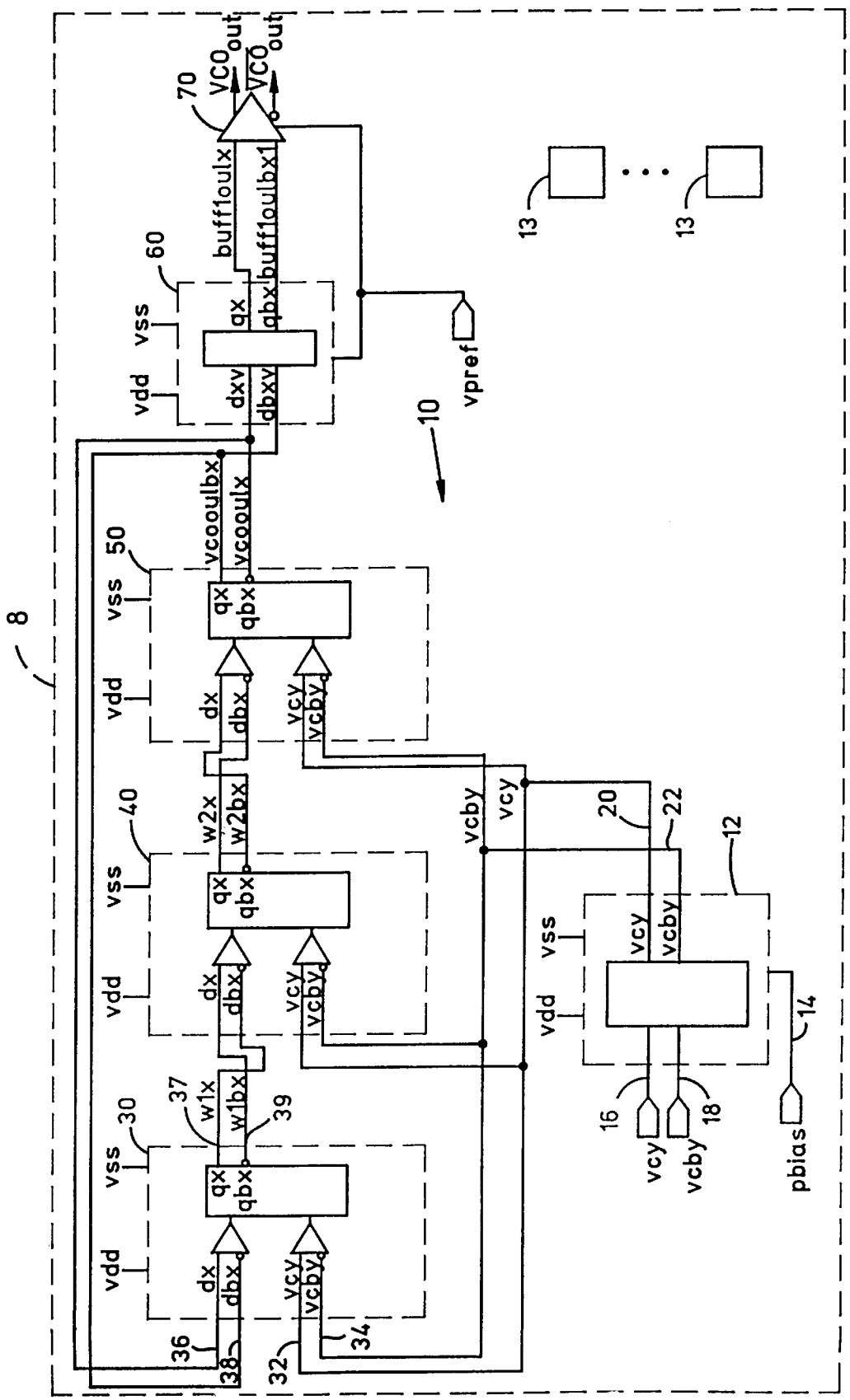
FIG. 1 is a block diagram showing a ring oscillator with a plurality of variable delay elements.

Specific apparatus and circuit embodiments of our invention are illustrated in schematic diagrams based on CMOS components arranged in differential structures. The teachings of our invention relate to CMOS ICs.

FIG. 1 illustrates a monolithic integrated circuit (IC) device 8 in which the essential complement of elements that make up our invention is fabricated. In FIG. 1. a VCO 10 comprises a control circuit 12 that produces a differential control voltage. The differential control voltage is provided to establish a delay in each of a plurality of variable delay elements, such as the variable delay elements 30, 40 and 50. More, or fewer, than three variable delay elements may be used; three are shown in FIG. 1 for illustration only. The variable delay elements 30, 40, and 50 are connected to form a ring oscillator whose output is buffered by a buffer circuit 60. The buffer circuit 60 produces complementary outputs fed to a differential driver circuit 70 that provides the output of the VCO as a complementary pair of signals $VCO_{out}$ and $\overline{VCO}_{out}$. Other circuits 13 are included in the IC device 8. Such circuits may include, for example, components of a phase-locked loop or, more broadly, the components of a high-speed serial data transmitter. Such circuits may include one or more VCOs that embody our invention.

The control circuit 12 receives a differential input voltage having two components—vcv and vcbv—on inputs 16 and 18. A bias voltage pbias is provided to the control circuit 12 on an input 14. The control circuit 12 responds to the differential input voltage (vcb-vcvb) by producing a differential control voltage (vcy-vcby) on outputs 20 and 22. Each variable delay element of the variable delay elements 30, 40, and 50 receives the differential control voltage components vcy and vcby on a first set of inputs, such as the inputs 32 and 34 in the variable delay element 30. In response to the magnitude of the differential control voltage (vcy-vcby), the variable delay element 30 delays a differential pair of input voltages—dx and dbx—provided on inputs 36 and 38, providing these voltages, after delay, as a differential pair of output voltages—wlx and wlbx—on outputs 37 and 39. The delay through the variable delay element 30 is established by the magnitude of the difference between the voltages vcy and vcby. This value may be denominated as a "differential control voltage". When this value changes, the delay through the variable delay element 30 changes. The output voltages wlx and wlbx on outputs 37 and 39 of the variable delay element 30 are cross-coupled to the inputs of the variable delay element 40; the cross-coupled inputs are delayed through the variable delay element 40 by an amount of time determined by the differential control voltage. The output voltages produced by the variable delay element 40 are cross-coupled to the inputs of the variable delay element 50. The voltages input to the variable delay element 50 are delayed by an amount of time determined by the differential control voltage. The variable delay element 50 outputs a differential pair of output voltages—vcoutx and vcoutbx. These output voltages are both cross-coupled to the inputs 36 and 38 of the variable delay element 30 and provided as inputs to the buffer 60. The voltages input to the buffer 60 are output as a differential pair of output voltages—buffloutx and buffloutbx. These output voltages are input to the driver 70 which provides them to other elements of an IC as the complementary signal waveforms $VCO_{out}$ and $\overline{VCO}_{out}$. These waveforms are periodic and may be square, triangular, or sinusoidal (or equivalent) in form.

The ring oscillator of FIG. 1 oscillates at a frequency that is determined by twice the sum of delays through the variable delay elements 30, 40 and 50. The frequency of oscillation is varied in response to variation of the delays through the variable delay elements 30, 40, and 50. Therefore, the frequency of oscillation of the VCO 10 may be varied in response to variation of the magnitude of the difference between voltages vcy and vcby.

FIG. 2 is schematic diagram illustrating the elements and structure of the control circuit 12. The control circuit includes two n-channel CMOS transistors Q1 and Q2 and four p-channel CMOS transistors Q3, Q4, Q5, and Q6. The sources of transistors Q1 and Q2 are connected to a voltage bus that provides a source voltage vss. The gate and drain of transistor Q1 are connected together and to the drain of transistor Q3. The gate of transistor Q3 (the input 16) receives one differential input voltage component—vcv. The source of transistor Q3 is connected to the drain of transistor Q5. The gate of transistor Q5 and the gate of transistor Q6 are connected in common to a bus provided for receipt of the bias voltage pbias. The sources of transistors Q5 and Q6 are connected in common to a bus for provision of a drain voltage vdd. The source of the transistor Q2 is connected to the bus by which the source voltage vss is provided. The gate and drain of the transistor Q2 are connected together and to the drain of the transistor Q4. The gate of the transistor Q4 corresponds to the input 18 to which the other component—vcbv—of the differential input voltage is connected. The source of the transistor Q4 is connected to the drain of the transistor Q6. One lead of a resistor R1 is connected to the source of transistor Q3 and the drain of transistor Q5; its other lead is connected to the source of transistor Q4 and the drain of transistor Q6. The differential control voltage components—vcy and vcby—are provided on the gate/drain connection of the transistor Q2 (output 20) and the gate/drain connection of transistor Q1 (output 22), respectively. Manifestly, transistors Q1 and Q2 are each in the well-known current mirror configuration. They may be referred to hereinafter as "current mirrors" or as "current mirror transistors."

In operation, a control current is generated in the control circuit 12 by operation of the transistors Q5 and Q6. The sum of the currents produced by the transistors Q5 and Q6 is the control current, which is available to be provided through the current mirrors Q1 and Q2. The transistors Q3 and Q4 control the portion of the total control current generated by the control circuit 12 through the current mirror transistors Q1 and Q2. In this regard, assume that the transistor Q3 is fully on, while the transistor Q4 is fully off. In this case, the currents produced by the transistors Q5 and Q6 are summed at the source of the transistor Q3 and provided through the current mirror Q1, maximizing the magnitude of the vcby component of the differential control voltage, while minimizing the magnitude of vcy. Similarly, all of the current is provided through the current mirror transistor Q2 when the transistor Q4 is fully on and the transistor Q3 is fully off.

The transistors Q1 and Q2 act as current mirrors to current source transistors in each of the variable delay elements 30, 40 and 50. The control circuit 12 allows VCO gain (MHz/V) adjustment. In this regard, the control circuit 12 exhibits a transition width that is the magnitude of the differential voltage, that is, the difference between vcv and vcbv, that is needed to completely steer current through transistor Q1 or transistor Q2. As the transition width increases, the VCO gain decreases. The minimum VCO gain occurs when the desired VCO range of frequencies can no longer be met. Transistors Q3 and Q4 and resistor R1 are optimized by size to produce a desired VCO gain curve. As the gate width/gate length ratio (W/L) of transistors Q3 and Q4 is decreased, the transition width of the control circuit 12 increases. As the resistance value of resistor R1 increases, the transition width of the control circuit 12 also increases.

Respecting FIG. 3, a schematic diagram of variable delay element architecture is presented. The variable delay element architecture of FIG. 3 represents the architecture of the variable delay elements 30, 40, and 50 of FIG. 1. Correspondence between FIG. 3 and the variable delay element 30 is for purposes of presentation only, it being understood that the description is of each of the variable delay elements 30, 40, and 50. The variable delay element 30 includes a first differential section D1 including n-channel CMOS transistors Q7, Q8, and Q11. A second differential section D2 of the variable delay element 30 includes n-channel CMOS transistors Q9, Q10 and Q12. The first differential section D1 has a first delay, and the second differential section D2 has a second delay which is shorter than the first delay. In the first differential section D1, the transistor Q1 functions as a current source, with its source connected to the bus that provides the source voltage vss. The gate of transistor Q1 corresponds to the input 34 on which the vcby component of the differential control voltage is received. The drain of transistor Q11 is connected in common with the sources of transistors Q7 and Q8. The transistors Q7 and Q8 are connected in a differential configuration, with the drain of transistor Q7 connected to one lead of a resistor R4, the other lead of which is connected to the bus that provides the drain voltage vddn. The drain of transistor Q8 is connected to one lead of a resistor R5, with other lead of the resistor connected to the drain voltage bus. In the second differential section D2 of FIG. 3, the transistor Q12 functions as a current source with its source connected to the VSS bus and its drain connected in common with the sources of the transistors Q9 and Q10. The drains of transistors Q9 and Q10 are connected, respectively, through resistor R4 and resistor R5 to the drain voltage bus. One component (dx) of a differential input voltage is provided through input 36 to the gate of transistor Q9 in the second differential section D2 and, through a resistor R2, to the gate of transistor Q7 in the first differential section D1. The second component of the differential input (dbx) provided at input 38 is connected to the gate of the transistor Q10 in the second differential section D2 and, through a resistor R3, to the gate of the transistor Q8 in the first differential section D1.

A first component (wlx) of a differential output is provided on the output 37 where the drains of the transistors Q10 and Q8 are connected in common with one lead of the resistor R5. The second component (wlbx) of the differential output is provided at output 39, where the drains of the transistors Q7 and Q9 are connected in common with one lead of the resistor R4.

As can be appreciated with reference to FIG. 3, the first and second differential sections D1 and D2 are connected in parallel, receiving as a differential input the signals applied at the ring oscillator input nodes 36 and 38, and providing a differential output at the nodes 37 and 39. The control circuit 12 drives the transistors Q11 and Q12 differentially, causing them to vary the amounts of current provided to the differential sections D1 and D2; it therefore converts input voltages applied at inputs 16 and 18 to currents provided to the differential sections D1 and D2 through the transistors Q11 and Q12, respectively. The relative magnitudes of the currents provided to the differential sections D1 and D2 vary according to the magnitude and sign of the differential control voltage (vcv-vcbv).

In operation, the variable delay element 30 provides a variable delay whose magnitude is directly related to the composite of the degrees of operation of the differential sections D1 and D2. In this regard, when all current is provided to the differential section D1, and it is fully on, the differential section D2 is altogether off, providing the longest delay. The delay through the differential section D1 is directly related to the magnitudes of the resistances provided by resistors R2 and R3 and to the gate widths of the transistors Q7 and Q8. Relatedly, the larger the magnitudes of resistance and the larger the gate widths? the longer the delay (and, the lower the maximum frequency at which the first differential section operates). Alternatively, when the differential section D2 receives all the current and the differential section D1 is altogether off, the delay is shortest (and the maximum frequency of operation the highest), there being no resistors connected between the inputs 36 and 38 and the gates of the transistors Q9 and Q10. The delay can further be reduced by reducing the gate widths of the differential transistors Q9 and Q10 in the differential section D2 relative to the gate widths of the differential transistors Q7 and Q8 in the first differential section D1. The magnitude of delay is varied between these two extremes by varying the relative levels of operation of the differential sections D1 and D2.

To increase the maximum frequency of operation of the variable delay element 30, several parameters may be adjusted in the circuit of FIG. 3. In this regard, the magnitudes of the resistances of the resistors R4 and R5 may be reduced, the gate widths of the differential transistors Q9 and Q10 may be reduced, while the gate width of the transistor Q12 may be increased. Note that reduction of the resistance values of the resistors R4 and R5 also decreases the delay of the first differential section D1. This can be compensated for by increasing the magnitudes of resistance of the resistors R2 and R3, increasing the gate widths of the differential transistors Q7 and Q8, or reducing the gate width of the transistor Q11.

Of course, once the desired high frequency is obtained by adjustment of the parameter values in the variable delay element 30, the open loop gain must be calculated to insure that the VCO 10 of FIG. 1 will in fact oscillate. The gain must be above 1, with some margin for modeling errors. To increase the open loop gain of the second (faster) differential section D2, the gate widths of transistors Q9, Q10 and Q12 can be increased.

Formally, the gain G of a differential section in a variable delay element is directly related to physical CMOS device parameters as follows:

$$G = gm \cdot r_0$$

where $r_0$ is the value of R4 or R5 and $$gm = \sqrt{2\mu c_{ox}(W/L)I}$$

where $\mu$ is carrier mobility, $c_{ox}$ is oxide capacitance, W is gate width in microns, L is gate length in microns and I is the current through the element.

FIG. 4 illustrates the W and L parameters in terms of a magnified top, plan layout representation of drain (D), source (S), and gate (G) regions of CMOS transistors in a CMOS IC device.

CMOS fabrication processes that are currently available produce CMOS transistors whose gate widths vary—usually within a known range. In order to ensure that gate width variation is predictable in a CMOS IC device that comprehends many transistors with wide-ranging characteristics, any transistor may be laid out and fabricated as a plurality (M) of transistors having predetermined gate dimensions (L and W). When these transistors are connected in parallel, they operate as a single transistor having a gate width MW. This is represented by transistors 1-$m$ in FIG. 4. Our invention contemplates gate width variation in this manner, as well as by the variation of the width of a gate of a single transistor.

Representative component values for elements of the circuits illustrated in FIGS. 2 and 3 are given in the following table. It is to be understood that these values merely represent the configurations of one embodiment. Therefore we do not intend them to limit the scope of our invention. For CMOS transistors, the ratio of gate width (W) to gate length (L) is given. Although the ratio itself is dimensionless, W and L are understood to be in microns.

TABLE I

| COMPONENT VALUES FOR FIGS. 2 & 3 | |
| --- | --- |
| R1 | 1.6 kΩ |
| R2, R3 | 1.56 kΩ |
| R4, R5 | 60Ω |
| Q1, Q2 | 100/1.2 |
| Q3, Q4 | 280/0.7 |
| Q5, Q6 | 180/2.5 |
| Q7, Q8 | 60/0.35 |
| Q9, Q10 | 90/0.35 |
| Q11 | 210/1.2 |
| Q12 | 300/1.2 |

These values yield a maximum frequency of 700 MHz for differential section D1 and 1.8 GHz for differential section D2. The open loop gain for section D1 is 8.1; for section D2, the gain is 3.3.

Our invention is intended to be incorporated into a monolithic integrated circuit device during whose manufacture, all elements shown in FIGS. 2 and 3 are fabricated on a substrate of silicon material. Known techniques of integrated circuit manufacture provide for the fabrication of resistors and CMOS transistors. For example, we have built the circuits described herein using a 0.35 micron digital CMOS fabrication process available from the International Business Machines Corporation, Armonk, N.Y.

Furthermore, even though our invention has been described with reference to CMOS transistors of a particular kind (n-channel and p-channel) it is to be understood that, with a change of each transistor to its complement and a change of bias voltages, the invention may be embodied in CMOS circuits that are complements of those described and illustrated.

While only certain preferred features of this invention have been shown by way of illustration, many changes and modifications will occur to those skilled in the art. Accordingly, it is to be understood the appended claims are intended to cover all such modifications and changes as fall within the true spirit and scope of our invention.

We claim:

1. A complementary metal-oxide semiconductor (CMOS) voltage controlled oscillator (VCO) comprising:
   a control means for producing a differential control signal; and
   a plurality of variable delay elements connected in a ring configuration;
   each variable delay element including first and second differential amplifier sections connected in parallel, each differential amplifier section including at least two CMOS transistors connected in a differential configuration, and a CMOS transistor current source connected to the at least two CMOS transistors and to the control means for operating the each differential amplifier section in response to a differential control signal, the first differential amplifier section having a first delay and second differential amplifier section having a second delay, the second delay being less than the first delay.

2. The CMOS VCO of claim 1, wherein delay through each variable delay element is determined by a degree of operation of the first differential section and a degree of operation of the second differential section.

3. The CMOS VCO of claim 2, each CMOS transistor being characterized by a ratio W/L, where W is a gate width and L is a gate length, wherein W/L of the two CMOS transistors in the first differential section is less than W/L of the two CMOS transistors in the second section.

4. The CMOS VCO of claim 1, each CMOS transistor being characterized by a ratio W/L, where W is a gate width and L is a gate length, wherein W/L of the two CMOS transistors in the first differential section is less than W/L of the two CMOS transistors in the second section.

5. The CMOS VCO of claim 1, each CMOS transistor current source including a CMOS transistor characterized by a ratio W/L, where W is a gate width and L is a gate length, wherein W/L of the CMOS transistor in the first differential section is less than W/L of the CMOS transistor in the second differential section.

6. The CMOS of claim 2, each CMOS transistor current source including a CMOS transistor characterized by a ratio W/L, where W is a gate width and L is a gate length, wherein W/L of the CMOS transistor in the first differential section is less than W/L of the CMOS transistor in the second differential section.

7. The CMOS VCO of claim 6, each CMOS transistor being characterized by a ratio W/L, where W is a gate width and L is a gate length, wherein W/L of the two CMOS transistors in the first differential section is less than W/L of the two CMOS transistors in the second section.

8. The CMOS VCO of claim 1, wherein the differential control signal has two components and the control means includes two CMOS transistor current mirrors, each for providing a respective component of the differential control signal.

9. The CMOS VCO of claim 8, wherein delay through each variable delay element is determined by a composite of the degrees of operation of the first differential section and the second differential section, the degrees of operation being established by the components of the differential control signal.

10. The CMOS VCO of claim 1, wherein each differential amplifier section has a maximum frequency of operation, the maximum frequency of operation of the first differential section being about 700 MHz and the maximum frequency of operation of the second section being about 1.8 GHz.

11. A monolithic complementary metal-oxide semiconductor (CMOS) integrated circuit (IC), comprising:
    a plurality of circuits; and
    at least one voltage-controlled oscillator (VCO) that includes:
    a plurality of variable delay elements connected in a ring configuration;
    each variable delay element including first and second differential amplifier sections connected in parallel, each differential amplifier section including at least two CMOS transistors connected in a differential configurations and a CMOS transistor current source connected to the at least two CMOS transistors and to the control means for operating each differential amplifier section in response to a differential control signal, the first differential amplifier section having a first delay and the second differential amplifier section having a second delay, the second delay being less than the first delay.

12. The IC device of claim 11, wherein delay through each variable delay element is determined by a degree of operation of the first differential section and a degree of operation of the second differential section.

13. The IC device of claim 12, each CMOS transistor being characterized by a ratio W/L, where W is a gate width and L is a gate length, wherein W/L of the two CMOS transistors in the first differential section is less than W/L of the two CMOS transistors in the second section.

14. The IC device of claim 11, each CMOS transistor being characterized by a ratio W/L, where W is a gate width and L is a gate length, wherein W/L of the two CMOS transistors in the first differential section is less than W/L of the two CMOS transistors in the second section.

15. The IC device of claim 11, each CMOS transistor current source including a CMOS transistor characterized by a ratio W/L, where W is a gate width and L is a gate length, wherein W/L of the CMOS transistor in the first differential section is less than W/L of the CMOS transistor in the second differential section.

16. The IC device of claim 12, each CMOS transistor current source including a CMOS transistor characterized by a ratio W/L, where W is a gate width and L is a gate length, wherein W/L of the CMOS transistor in the first differential section is less than W/L of the CMOS transistor in the second differential section.

17. The IC device of claim 16, each CMOS transistor being characterized by a ratio W/L, where W is a gate width and L is a gate length, wherein W/L of the two CMOS transistors in the first differential section is less than W/L of the two CMOS transistors in the second section.

18. The IC device of claim 11, wherein the differential control signal has two components and the control means includes two CMOS transistor current mirrors, each for providing a respective component of the differential control signal.

19. The IC device of claim 18, wherein delay through each variable delay element is determined by a composite of the degrees of operation of the first differential section and the second differential section, the degrees of operation being established by the components of the differential control signal.

20. The IC device of claim 11, wherein each differential amplifier section has a maximum frequency of operation, the maximum frequency of operation of the first differential section being about 700 MHz and the maximum frequency of operation of the second section being about 1.8 GHz.

* * * * *